United States Patent [19]
Slocum

[11] Patent Number: 5,711,647
[45] Date of Patent: Jan. 27, 1998

[54] METHOD OF AND APPARATUS FOR LOCATING AND ORIENTATING A PART ON A GRIPPER AND TRANSFERRING IT TO A TOOL WHILE MAINTAINING LOCATION AND ORIENTATION ON THE TOOL

[75] Inventor: Alexander H. Slocum, Concord, N.H.

[73] Assignee: AESOP, Inc., Concord, N.H.

[21] Appl. No.: 324,255

[22] Filed: Oct. 17, 1994

[51] Int. Cl.$^6$ .................................................. B65G 65/00
[52] U.S. Cl. ..................... 414/749; 294/1.1; 414/937; 414/941
[58] Field of Search ............................ 414/729, 749, 414/331, 277, 416, 937, 941; 901/6, 30, 40; 294/1.1, 86.4, 902; 198/345.2, 803.14

[56] References Cited

U.S. PATENT DOCUMENTS 5,375,959  12/1994  Trento .......................... 414/277

FOREIGN PATENT DOCUMENTS 2156582  10/1985  United Kingdom .............. 414/941 X

*Primary Examiner*—Donald W. Underwood
*Attorney, Agent, or Firm*—Rines and Rines

[57] ABSTRACT

A system for achieving a high degree of location and orientation accuracy and repeatability of a part, such as a semiconductor wafer, for storage of the part in a cassette or placement on a process tool while being able to grasp the part, while maintaining maximally repeatable location, orientation, and cleanliness, while moving it from one tool to another, such as a process tool to a cassette. This is accomplished by providing in one case a pattern of six grooves on the circumference of a part, typically spaced 60 angular degrees apart, and a pattern of three curved contact surfaces on a gripper plate and three curved contact surfaces on a tool plate, where the plates nest such that the three curved surfaces on the gripper plate would make contact with the sides of three of the grooves in the part, and when the gripper plate that is holding the part lowers the part onto the tool plate, the three curved surfaces on the tool plate would make contact with the sides of three of the other grooves in the part as the part is unloaded from the gripper plate and comes to rest on the tool plate. Thus at all times the part position is kinematically uniquely established and mathematically defined in space which provides a high degree of repeatability, and furthermore minimizes stresses placed on the part that would otherwise occur from the typical action of clamping-type gripping mechanisms. In the second case, where it is not feasible to put grooves in the parts, the same nesting plates would each have three sets of support units that each have orthogonal curved surfaces such that when a part rests on the support points, three of the support point curved surfaces support the weight of the part, and the other three orthogonal points restrain the lateral position. In either case, the plates can be stacked horizontally, or at an inclined angle.

28 Claims, 8 Drawing Sheets

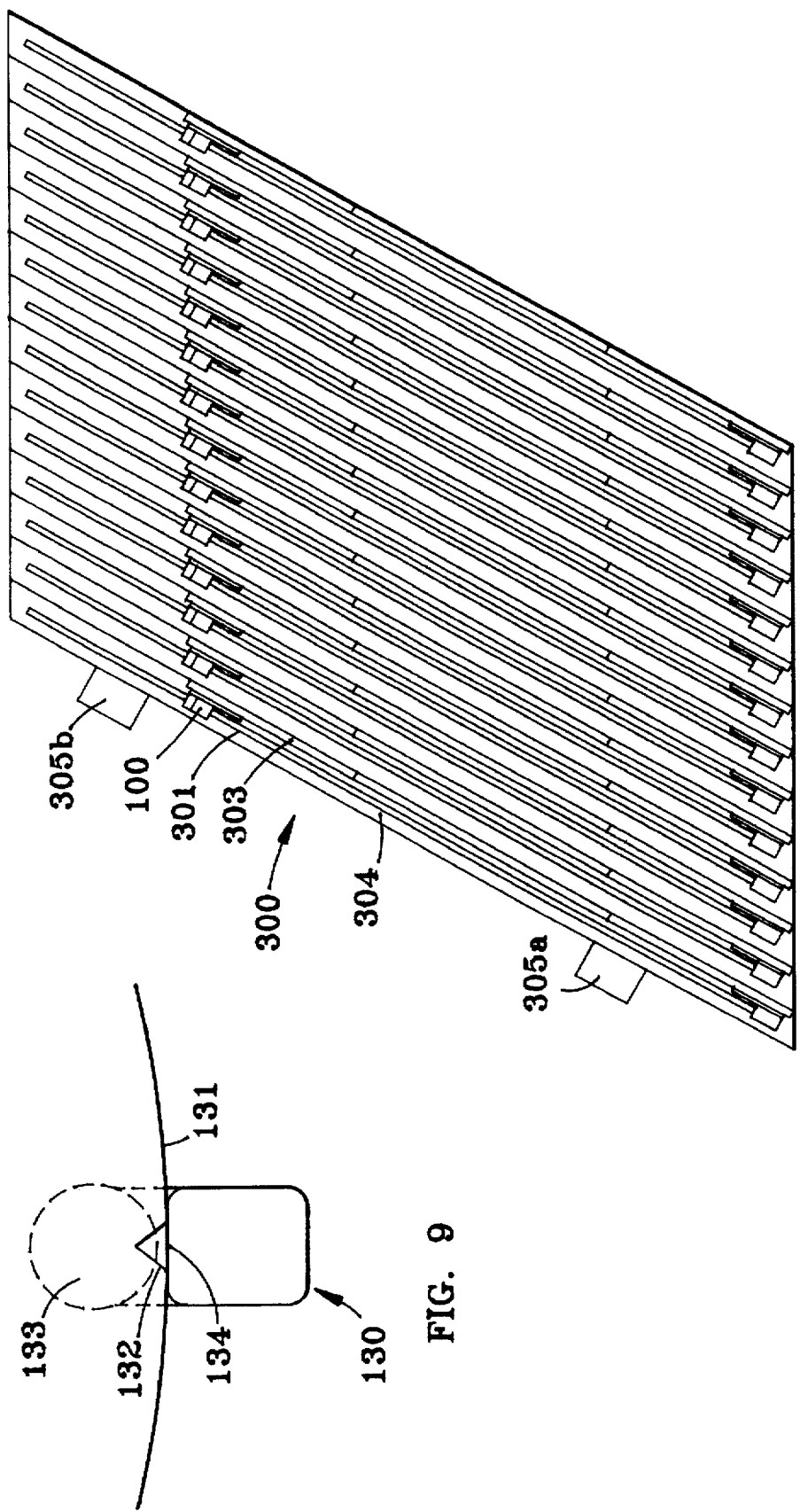

METHOD OF AND APPARATUS FOR LOCATING AND ORIENTATING A PART ON A GRIPPER AND TRANSFERRING IT TO A TOOL WHILE MAINTAINING LOCATION AND ORIENTATION ON THE TOOL

The present invention relates to techniques for gripping parts and transferring them to tools or to storage; being more particularly directed to the gripping and placement of parts such as semiconductor wafers and the like, with a high degree of location and orientation accuracy and repeatability for either or both of storage in a cassette or placement on a process tool and while maintaining maximally repeatable location, orientation, and cleanliness, (and being able to also minimize contact stress due to specially shaped contact points which may also be specially mounted to reduce vibration transmission.)

BACKGROUND

While, as later made more evident, the invention is of rather generic utility with all kinds of parts, it is particularly useful for delicate and small parts such as those used in solid state electronics and related fields. Conventional silicon wafers manufactured in semiconductor fabrication plants (wafer fabs), for example, are typically round or square, and are cut from billets whose outer surfaces have been ground. It is very expensive to grind the outer surface of such a silicon billet with great precision, so the wafers cut from the billet do not have an outer edge that reflects the accuracy to which it is desired to center the wafer on a process tool. In addition, in order to grasp a wafer, a robotic device typically brings the wafer to rest on three points underneath the wafer, and then radially pulls the wafer against hardstops. This leads to sliding contact over relatively long distances which increases the chance for particle generation. Furthermore, when the wafers are loaded into cassettes, the cassettes have a series of slots that allow the wafer to be slid into the cassette which essentially causes the entire front portion of the wafer to be cantilevered. In addition, in order to keep the wafer from jiggling in the cassette during transport, which also leads to sliding contact and particle generation, the wafers are often clamped in place, greatly increasing the stress level in the wafer. This inadequate way of storing and handling cassettes is particularly unacceptable for the larger wafers contemplated by industry, on the order of 300 mm in diameter. Even with existing smaller wafers, the tolerances on the wafer and the manner in which it is stored lead to a great increase in the cost and potential for failure of the robotic equipment needed to unload wafers from cassettes and load them into process tools, and then put them back into cassettes.

The art has lacked a suitable method for the wafer, robotic gripper, and tool to act as an integrated machine system, as opposed to individual semi-related discrete parts. The key to a design methodology for such an integrated system of the sort required is mathematical determinism which allows the system to be modeled with straightforward linear relations that allow the design to be checked before it is built; and, because it is mathematically deterministic, it has a very significantly greater chance of performing accurately, repeatably and without failure.

Since Egyptian times, it has been known that in order repeatably to position something and not have it jiggle on its mounts, one needs to use a tripod-type (three point) structure. With respect to manufacturing, the concept of how to fixture an object transcends the simple idea of a tripod into the more complex notion of mathematically requiring the number of contact points used to be equal to the number of motions (degrees of freedom) that are to be restrained. For holding an object in space, there are three translational and three angular motions that must be restrained. This means that at least six contact points are required. Such a constraint situation is often realized by one of two means. The first means is that of the so called three-two-one fixturing method. In this method, a prismatic part is first brought to rest on three points. This defines one translational and two angular degrees of freedom. The part is then slid on these three points until it makes contact with two other points which then defines one more translational and one angular degree of freedom. The part is then slid over the three points and across the two points to make contact with a final point which then restrains the final translational degree of freedom. Clamping bolts then keep the part pushed into this nest of six contact points. The primary problem with such a system, however, is that whenever a point contact is made with a body, there is a micro indentation that occurs. This indentation is described by well-known Hertz contact stress theory which is widely used by the bearing industry. The result is that the first three contact points create three micro indentations that on a microscopic scale define all six degrees of freedom. Thus, when the part is slid over to the other two contact points, the micro indentations plow across the surface. The result is residual stresses which prevent the part from ever fully establishing the degree of contact required fully to seat the part against the remaining points. In addition, the residual stresses can relax with time causing an apparent shift in position of the part.

To remedy this situation, the six contact points must be established almost simultaneously. In fact, in the late 1800's, James Clerk Maxwell sought such a system, and Prof. Ball, the father of modern kinematics (e.g., screw theory) defined for him an extension of the well-known tripod concept in the form of a ball that rests in a tetrahedral mount on three points and a second ball that rests in a triangular groove on two points, and a ball hat rests on a flat plate for the final and sixth point. The difference here is that the balls all come in contact simultaneously with their respective seating points. It should be noted that this requires three different seating structures: a tetrahedron, a groove, and a flat. In the interest of greater manufacturability, three of the same structures are desired, and this can be obtained in the form of the use of three grooves.

The mechanics of three groove couplings has been considerably explored by applicant, theoretically and experimentally, as described in: Slocum, A. H. "Kinematic Couplings for Precision Fixturing—Part I—Formulation of Design Parameters," *Precision Eng.*, Vol. 10, No. 2, April 1988, pp 85–91; Slocum, A. H. and Donmez, A., "Kinematic Couplings for Precision Fixturing—Part II—Experimental Determination of Repeatability and Stiffness," *Precision Eng.*, Vol. 10, No. 3, July 1988, pp 115–122; and Slocum, A. H. "Design of Three-Groove Kinematic Couplings," *Precision Eng.*, Vol. 14, No. 2, April 1992, pp 67–76.

Such kinematic coupling techniques were applied by applicant in his U.S. Pat. No. 4,574,625, manually attaching a probe arm with great repeatability to a machine, and yet having the capability for the machine to crash and break the probe arm off and still allow the operator to pick up the disengaged probe arm and reattach it with the same degree of repeatability. This device uses such a kinematic coupling that is force preloaded with a magnet.

Applicant's further U.S. Pat. No. 4,685,661 describes a servo-controlled fixturing system where the part is brought to position by coordinated motion of servo-actuators that in effect implement the notion of a three-two-one fixturing theory on a prismatic part.

Another example of such deterministic machine design is in applicant's U.S. Pat. No. 4,694,230 where servo-controlled balls in grooves control and define the position of a robotic micro manipulator.

In the context of vibration attenuation, another field, there are countless patents and designs for vibration absorption mechanisms, where there is an outer member and an inner member fixed to it via a lossy material such as rubber. An example is U.S. Pat. No. 4,865,299 which also displaces a fluid as a means of damping radial motions. In this type of system, however, the motion of the damped member is not deterministically constrained, and perhaps most important, when it is used to anchor one component to another, it is bolted to the components and the accuracy of location is poor which requires the components' relative position to be carefully adjusted. What is needed is an effective vibration absorber that allows the components it connects to be easily and very accurately coupled together, and allows the components to be separated and brought back together in a highly repeatable manner without requiring realignment of the components.

The kinematic coupling mount is thus now a well-understood element, like a screw thread, and in accordance with the present invention, such is used in new geometries and arrangements to form a unique and novel assembly that remarkably accomplishes the desired goals above described and not previously attained, for gripping and accurately and repeatably locating and orienting such parts as semiconductor wafers and the like without any of the previously described limitations of prior art techniques.

In accordance with the invention and, indeed, in order to obtain high repeatability when mating with a process tool, moreover, a part storage element must have precisely located locating features that uniquely define the location of the element with respect to a process tool when mating elements are engaged, and these features must be carefully defined such that they define a unique orientation of the storage element with the process tool to ensure, for example, that in the case of manual loading, the storage element is not located backwards on the process tool. This and other requirements are also ordinarily met by the invention.

OBJECT OF THE INVENTION

An object of the invention, thus, is to provide a new and improved method of and apparatus for locating with a high degree of location and orientation accuracy and repeatability, a part, such as a silicon wafer, or the like, for storage of the part in a cassette or placement on a process tool while the part is grasped or gripped, maintaining maximally repeatable location, orientation, and cleanliness.

A further object of this invention is to provide such a novel apparatus in which a pattern of six grooves is employed on the circumference of the part, typically spaced 60 angular degrees apart, and a pattern of three curved contact surfaces are employed on a gripper plate and three curved contact surfaces on a tool plate, where the plates nest such that the three curved surfaces on the gripper plate make contact with the sides of three of the grooves in the part, and when the gripper plate that is holding the part lowers the part onto the tool plate, the three curved surfaces on the tool plate would make contact with the sides of three of the other grooves in the part as the part is unloaded from the gripper plate and comes to rest on the tool plate.

A further object is to establish in space at all times the position and orientation of a part kinematically, uniquely, and mathematically, which provides a high degree of repeatability.

A further object is to provide such a novel apparatus kinematically holding the part when it is held in a robot gripper and when it is transferred from the gripper to a tool, minimizing stresses placed on the part that would otherwise occur from the typical action of prior art clamping-type gripping mechanisms.

A further object is to provide for the apparatus intermingling support and gripping arms that can be used to hold a wafer in a true kinematic or in a quasi-kinematic mode to enable the wafer to be stored and moved with a minimum amount of mechanical complexity.

A further object is to provide means to repeatably locate one component with respect to another, so the component can be built up on a standard tooling fixture and then moved to its final location on a machine and be located there with a very high degree of repeatability and a high degree of vibration absorption between the components.

A further object is to provide a grid of raised support points for kinematically gripping small or large wafers or the like, while imposing similar stress and deflection states in the parts, on rigid plate means, or on flexible conveyor means.

An additional object is to provide means to allow a part, once it is kinematically mounted, to be able to be vibration isolated from the system to which it is mounted, while maintaining a high degree of repeatability should the component have to be removed for service or repair and then be replaced.

A still further object is to provide an idealized shape for the rounded surfaces that lets them slide across flat surfaces and then slide into the aligning grooves with a minimum amount of stress and therefore wear and particle generation.

Other and further objects will be explained hereafter and are more fully delineated in the appended claims.

SUMMARY

In summary, the invention embraces an apparatus for kinematically gripping and transferring a part having, in combination, nestable planar gripper and tool arms each respectively provided with a set of three equilaterally co-planar spaced curved contact surface elements, with the elements of the gripper arm circumferencially displaced 60° from the corresponding elements of the tool arm; the part having six essentially 60°-spaced peripheral grooves; means for placing or storing the part upon the gripper arm with the gripper arm set of elements contacting three of the plate grooves to hold the part; means for relatively lowering and raising the gripper arm relatively lowering and raising the gripper arm relative to the nesting tool arm to cause the tool arm set of elements to contact the other three of the part grooves so as to transport and transfer the part from the gripper arm to hold the same on the tool arm, or to cause the gripper arm to pick up the part from the tool arm, all with the location of the part uniquely established and defined in space, thus enabling repeatability while minimizing imposing stresses on the part.

Preferred and best mode designs, details and modifications are hereafter more fully set forth.

DRAWINGS

The invention will now be described with reference to the accompanying drawing in which:

FIG. 1 is a top view of a system for storing two sizes of wafers, such as 300 mm or 200 mm round silicon wafers, which shows the stationary stack of holding fork plate with their kinematic location surfaces (cones) and a large wafer on top and the outline of a smaller wafer beneath it, and with the gripper fork plate, which is identical to one of the stack elements, just positioned to pick up the wafer;

FIG. 9 is a schematic close-up view of a conformal radial contact zone that illustrates the design ability to tolerate the presence of a notch in a wafer;

FIG. 10 is an end view of a collection of wafer support arms, configured in a manner similar as that shown in FIG. 3, but with the wafers inclined at a 60 degree angle to minimize gravitational stress;

Figure 14:
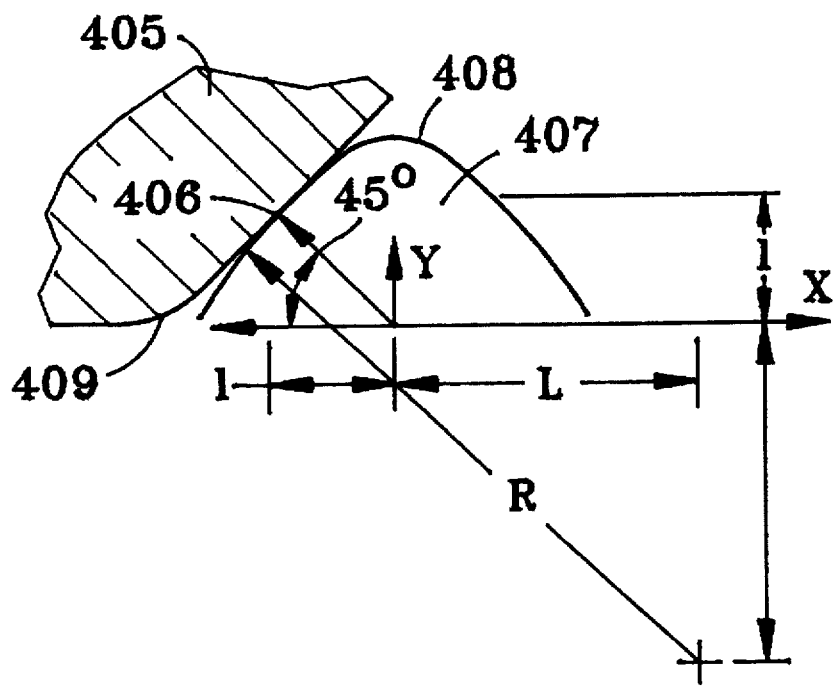
FIG. 14 is a schematic drawing of the theory of the optimal shape for the contact surface and the correct shape for the top of the support point for blending with the side shapes and for minimum stress in a kinematic coupling as the part slides across the top of a rounded coupling member on its way to engageing a vee-shape groove.
Figure 15A:
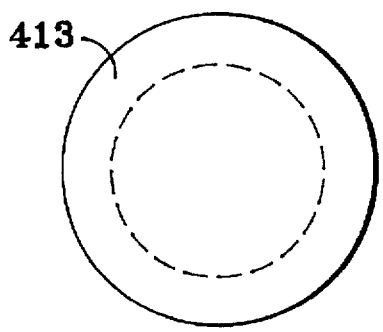
Figure 15C:
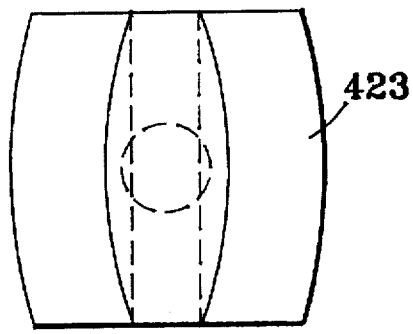
Figure 15B:
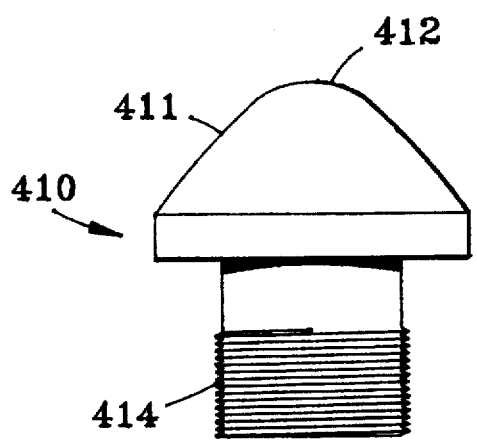
Figure 15D:
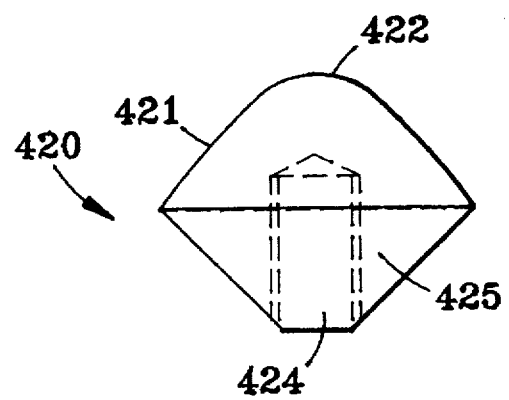
Figure 16:
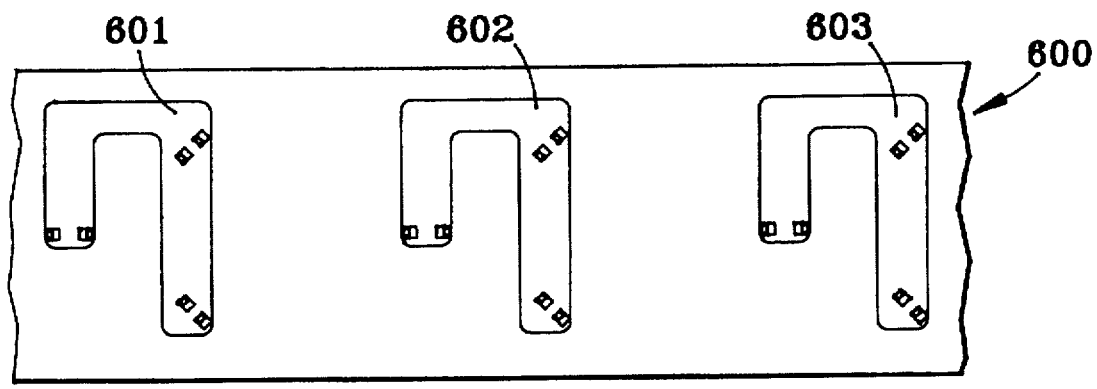

FIG. 15 illustrates two practical implementations of the theory of FIG. 14, where in one case, for ten times improvement in load capacity, the support point is a surface of revolution with the contact point radius of curvature being 10 times the nominal ball diameter; and in the orther case, a 100 times improvement in load capacity is also obtained by making the axis of rotation radius of curvature 10 times the nominal ball diameter; and FIG. 16 schematically illustrates a conveyor system with the kinematic support points attached to a plate that is attached to the conveyor, such that even when the conveyor rounds a corner, the support points maintain constant distance.

DESCRIPTION THE INVENTION

The drawings illustrate means for repeatably and accurately locating and orienting a wafer while it is being moved by a gripper which is typically transferring the wafer from a storage cassette to a process tool.

Figure 1:
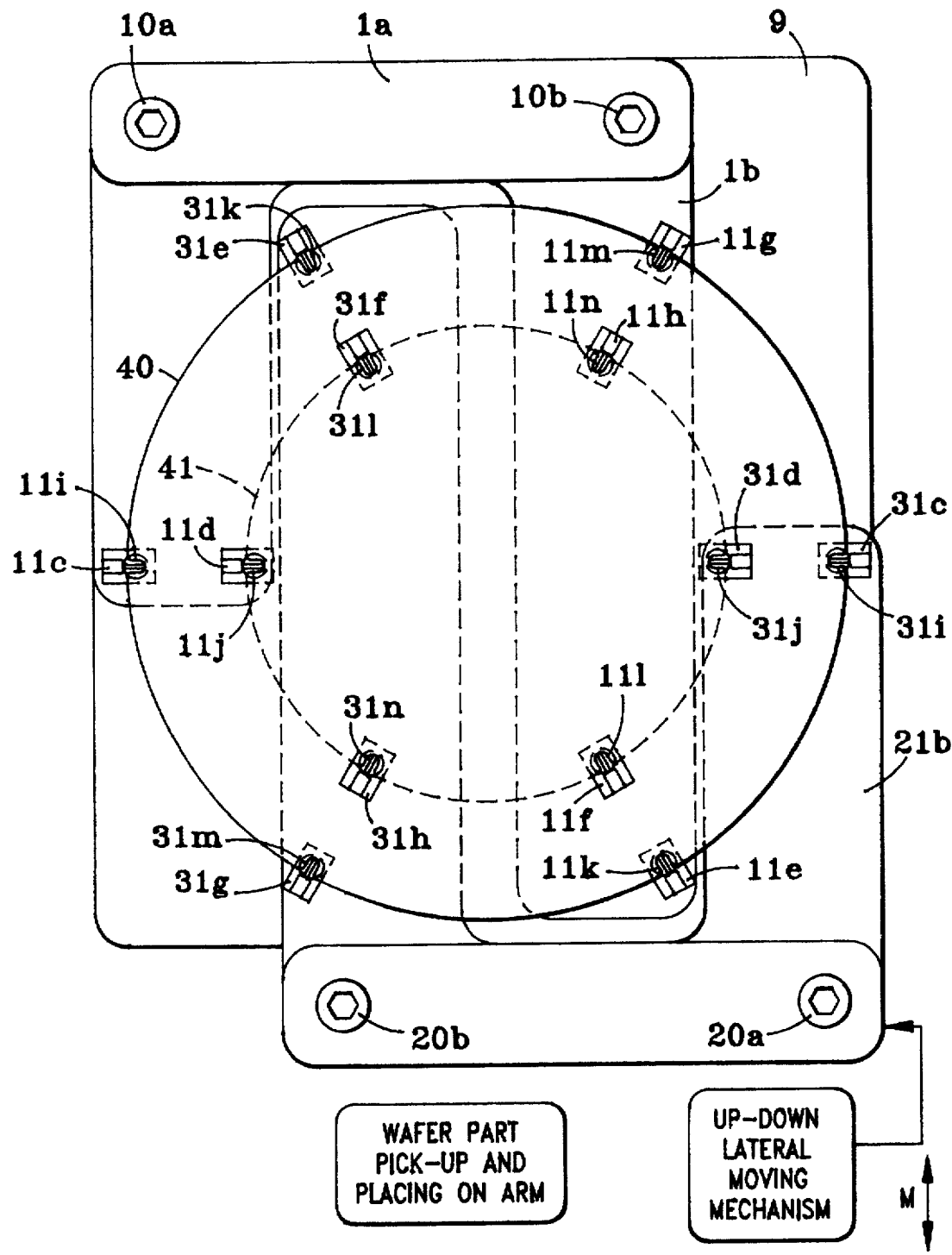

In the embodiment of FIG. 1, the illustrative part is shown as a large round wafer 40 (say 300 mm) and a smaller wafer 41 (say 200 mm) as of silicon, of the type used in the manufacture of integrated circuits, flat panel displays and other electronic products.

Figure 3:
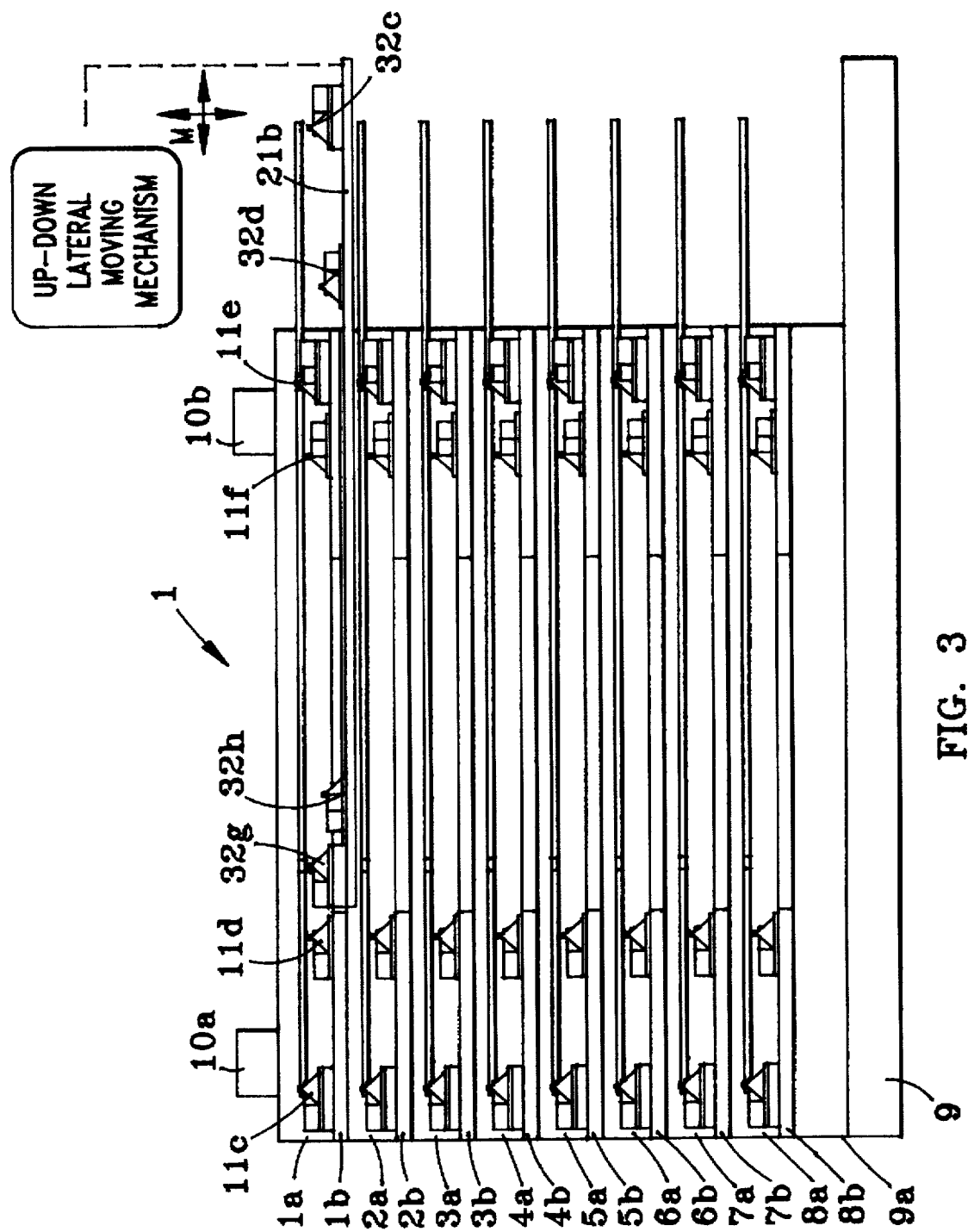
FIG. 3 is a front view of the wafer-holding stack that shows a large wafer on the top level, and the front section of the gripper arm just coming in to get a wafer.

Planar interleaving gripper and tool arms or plates 21b and 1b are relatively moveable downwardly and upwardly of one another as schematically shown at M in FIGS. 1 and 3, during their interleaving or intermingling nesting operation to hold and transfer the part between them. In this preferred mode, the wafer is provided with six 60° circumferentially spaced grooves 11g, 31c, 11e, 31g, 11c and 31e for the larger diameter wafer 40, and 11h, 31d, 11k, 31h, 11d, and 31f for the smaller diameter wafer 41.

The gripper arm 21b is provided with two sets of three equilaterally co-planar spaced contact elements each at 120° circumferential spacings along respective circles corresponding to the outer peripheries of the larger and smaller wafers 40 and 41, respectively. The set of equilaterally spaced cones 11g, 11e, and 11c on the planar arms of the U-shaped gripper arm 1b correspond to grooves 11m, 11k, and 11i of the larger wafer 40; and the 60°-shifted equilaterally set of spaced cones 31g, 31e, and 31c on the planar arms of the interleaved U-shaped tool arms 21b correspond to grooves 31m, 31k, 31i of the large wafer. Similarly, the equilaterally spaced set of cones 11f, 11d and 11h of the gripper arm 1b correspond to the diameter of smaller wafer peripheral grooves 11l, 11j, 11n; and the cone set 31f, 31d, 31h corresponds to smaller wafer grooves 31l, 31j, and 31n, respectively.

The stationary stack is shown made up of the U-shaped wafer tool-holding planar arms 1b bolted together by bolts 10a and 10b with spacers, such as 1a therebetween. Base plate 9 stabilizes the system and also acts as a plate to which an enclosing protective cover may be attached. The wafer-tool holding arm 1b has the before-described wafer-holding curved contact surfaces in the form of cones pressed into it. Two rings of cones are shown for the two different diameters or peripheral dimensions of wafers. The outer ring of cones 11c, 11g, and 11e holds the large wafer 40 by contacting the grooves 11i, 11m, and 11k. In order for tool arm 1b to hold the small wafer 41, the inner ring of cones 11d, 11h, and 11f, contact grooves 11j, 11n, and 11l, respectively. A cone in a groove (rectangular, for example) can only make contact at two points; thus the set of three cones in the three grooves makes contact at six unique points.

In order for the gripper arm 21b, attached to a conventional up-down and lateral moving mechanism (shown schematically at M but not detailed because there are so many different well known types) by bolts 20a and 20b through plate 21a, would first position itself under, for example, the larger wafer 40. The gripper arm 21b would have its cones 31c, 31g, and 31e aligned below grooves 31i, 31m, and 31k in the wafer 40. By rising up, the wafer would be transferred from the set of cones 11c, 11g, and 11e on the arm 1b to the set of cones 31c, 31g, and 31e on the gripper arm 21b. Once the wafer is picked up, the gripper arm would then move out horizontally or laterally.

In order for the gripper arm 21b to pick up the small wafer 41, once again, it would position itself under the wafer. The gripper arm 21b would have its cones 31d, 31h, and 31f aligned below grooves 31j, 31n, and 31l in the wafer 41. By elevating, the wafer would be transferred from the set of cones 11d, 11h, and 11f on the tool arm 1b to the set of cones 31j, 31n, and 31l on the gripper arm 21b.

Figure 4:
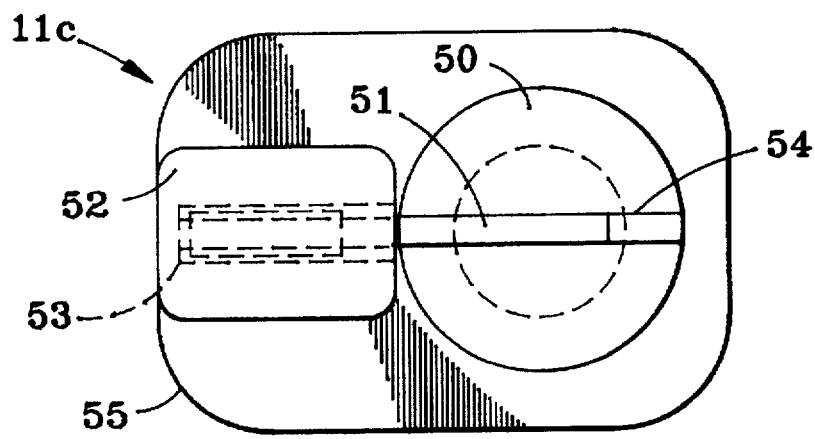
FIG. 4 is a top view of a preferred configuration for the wafer-holding cones, which shows not only a simple cone to provide two contact points for kinematic location, but also a center groove in the cone and a voice-coil actuated blade which provides a radial force to the wafer after it is kinematically seated.
Figure 5:
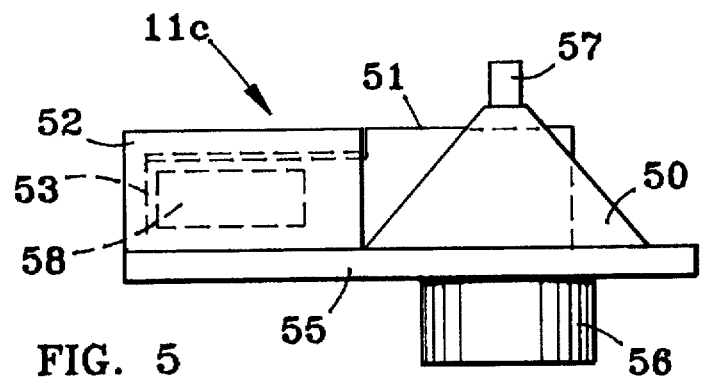
FIG. 5 is a side view of the wafer-holding cone.

Turning now to the design of the protruding cones that the wafer rests upon, FIGS. 4 and 5 show preferred details of a kinematic location wafer-holding cone 11c. As noted above in the theory of kinematic coupling, it is important to provide six contact points which typically are obtained from three sets of two points which are obtained by three curved surfaces contacting three grooves. In this case, the curved surfaces are formed by the cone 50. The cone has a cylinder 57 on the top, FIG. 5, which acts as a safety device to keep the wafer from sliding off the cone should the system be jarred. The protruding cone 50 is located with respect to the wafer-holding arm 1b by the base cylinder 56 which presses into a hole formed in the arm. Beyond the use of a simple cone, 11c shows a clamp for applying a radial force to the wafer, operated pneumatically, by a vacuum, or in some cases electromagnetically. The cone has a groove 54 cut in it which would lie along a radial line of the wafer. A bar 51 in the groove has a magnet 58 pressed into its end, and coils (not shown in detail here) 53 encased in housing 52 to provide the actuation force. Three such systems, for example, 11c, 11g, and 11e, act together to radially clamp the wafer during transport if high speed or shock resistant transport is required.

The use of radial clamps, as above explained, are an option; but in most applications, for simplicity, reliability, and maximum cleanliness, the wafers just sit on the curved seats. If desired for safety, as before mentioned, the tops of the spherical seats can have protruding cylindrical extensions that would prevent the wafer from ever being able to come off. These extensions can be fixed, or they can be plungers that extend after the gripper is withdrawn from a tightly packed space such as a storage cassette or from a process tool; for example, a tool used in a furnace in which the wafers are stacked with little space between them. In general, the fewer locations the wafer is touched, the lower the particle generation. Furthermore, the less forces or stresses that are put on the wafer, the less the chance of causing micro-cracking in the lattice which can ruin the operation of integrated circuits.

Figure 2:
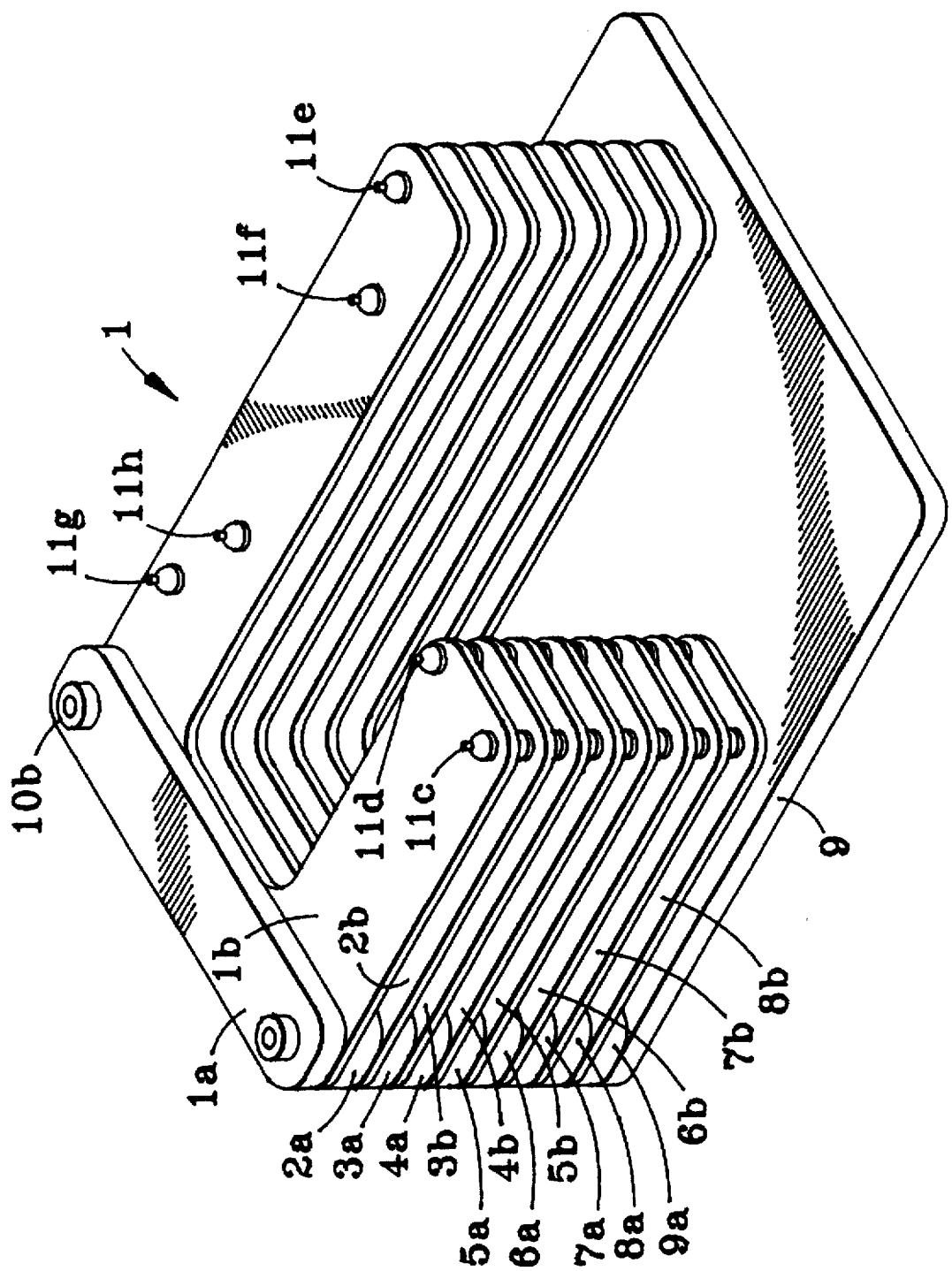
FIG. 2 is an isometric view of the wafer-holding stack that shows eight storage levels made from built-up modular elements, and with each of these modular elements actually made from precision-blanked components, for low cost, bolted together for the height required.

FIGS. 2 and 3 show isometric and end conceptual views respectively of an assembly of modular wafer storage plates. In FIG. 3, the gripper fork arm 21b, which is identical to one of the stack elements 1b, is shown positioned just prior to its picking up a wafer. All the plates are held to the base 9 by bolts 10a and 10b. Plates 1b, 2b, 3b, 4b, 5b, 6b, 7b, 7b, and 8b are spaced by the bolt heads and each other by spacer plates 1a, 2a, 3a, 4a, 5a, 6a, 7a, 8a, and 9a respectively. In FIG. 2, the cones 11c, 11g, and 11e, as before explained, are for large wafer support, and the cones 11d, 11h, and 11f for small wafer support. A protective removable cover (not shown) may easily be installed over the entire assembly to protect the wafers during transport. In FIG. 3, moreover the cones 11c and 11e on storage arm 1b and 32g and 32c on gripper arm 21b are for large wafer support; and cones 11d and 11f on storage arm 1b and 32h and 32d on gripper arm 21b are for small wafer support.

The wafer holding arms can also be used in a tilted format to minimize wafer stress, if required, and the tip on the wafer holding cone will prevent the wafer from sliding off, though this construction may somehow increase wafer handler cost and complexity. The issue of stress in the wafer causing micro cracks in the wafer, however, is an important consideration. When held in the horizontal position, the stresses due to the weight of the wafer are not that great. While held in the vertical position, the stresses are even less; but, in order to hold the wafer in this position and to grip it in the vertical position requires relatively large radial forces. The potential for local over-stressing and generation of particles at the local stress interface regions makes this undesirable. A mechanism may therefore be provided to tilt the wafer storage box, but this adds complexity and cost and reduces reliability of the system.

In some cases, indeed, for very large wafers, it may be desirable to size the cones and grooves such that when the wafer is seated on the cones, its backside is also supported by a large flat plane created by the support arms, or a pad attached to the surface of the support arms. This increases the chance for backside contamination of the wafer, but this may be an acceptable tradeoff in some situations. In this manner, the wafer is held in a quasi-kinematic fashion.

There are applications, furthermore, where it is not desirable to notch the parts, and it is acceptable for the center location not to be precisely known. Examples would be for some wafer designs, and for containers for biological samples which must be kept perfectly round for stress or process cleanliness reasons. In such case, a quasi-kinematic holding apparatus may be used that still takes advantage of the novel intermingling design of the storage unit and gripper arms, but sacrificing rotational accuracy, not always of concern to some systems. In other systems, however, markings on the part and subsequent active orientation may be used. To quasi-kinematically hold the part, the part is then just round, with no slots, and the tapered pins are replaced by modular shelf pins, either passive or with a similar radial clamping mechanism to help center the component and lock it in place. The motivation radially to lock the wafer is to minimize the stress in the system that occurs by transverse vibration during handling.

Figure 6:
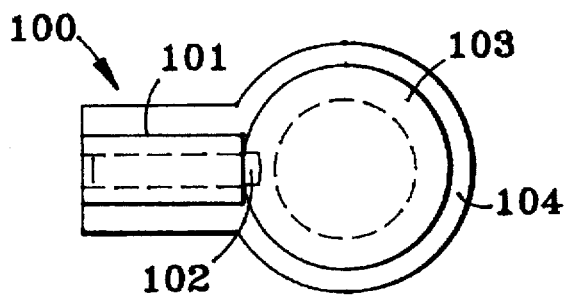
FIG. 6 is a top view of an alternate support point equivalent to the unit shown in FIG. 4, but here the unit is quasi-kinematic, and does not require the wafer to be grooved or notched.
Figure 7:
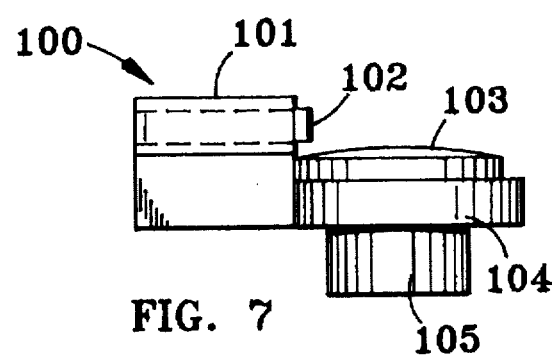
FIG. 7 is a side view of the alternate support point of FIG. 6.

FIGS. 6 and 7 illustrate the top and side views of a design for such a modular quasi-kinematic support button 100. The wafer would rest on a set of three of these curved surface units, equilaterally distributed, with vertical motion and tilt of the wafer in two planes defined by the contact between the backside of the wafer and the rounded contact surface points 103. Thus, three degrees of freedom of the wafer are defined by three mechanical points of curved surface contact, forming a geometric constraint. The body 104 of the unit 100 has a post 105 that presses into holes on the interleaving support arms shown in FIG. 1. Orthogonal radial location is established by the radial locator 101, which typically may be a solenoid-type device with plunger 102. If only one such device is used, the wafer will be left in contact with two hard stops when it is to be raised, and this may produce drag, but such will depend on the preload forces used.

Transfer of the part held by one of the plate arms as the part rests on the equilaterally spaced curved surfaces 103 and is held laterally or radially by at least two of the orthogonal curved surfaces 102, is effected by moving the arm into nesting with the other plate (as in FIG. 1) and transferring the part to the corresponding equilaterally spaced curved supports, 60° displaced, of the other arm.

Figure 8:
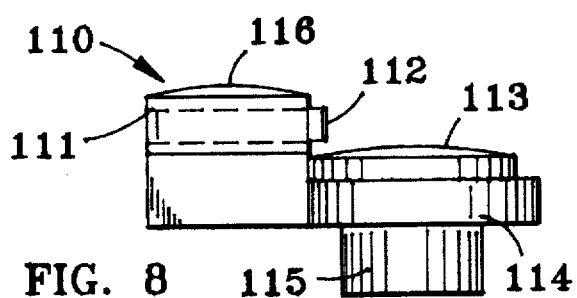
FIG. 8 is a side view of a further modification also equivalent to the unit shown in FIG. 4 for supporting a smaller part near the inside edges of the intermingling fingers of the support devices, but again with the unit quasi-kinematic and not requiring the wafer to be grooved or notched, and with the top of the highest point rounded, so that a larger diameter wafer can rest upon it.

In order to minimize stress in the wafer, the protruding equilaterally spaced vertical contact buttons can be separate from the orthogonal radial location curved cylindrical surfaces. In the interleaving gripper concept, the tops of the units used to hold the smaller (200 mm) wafers can be made rounded effectively to support the backside of the larger (300 mm) wafer on a 200 mm diameter. This greatly reduces deflection in the 300 mm wafer and thus minimizes required wafer thickness which can result in substantial savings. The orthogonal radial location may be done out at 300 mm, as discussed before with an active or passive system. The concept for the inner support point is illustrated in FIG. 8, where a unit 110 that can be pressed into one of the intermingling support arms shown in FIG. 1, is shown in side view. Here, the radial locating and clamping mechanism 111 with its radially moving (e.g., by solenoid means) plunger 112 with a circular or rounded end to reduce stresses, has a curved or rounded top surface 116 so that it may be one of the set of three support points for a wafer on top of it. The rounded end of plunger 112 may even have a negative curvature more closely to match the curvature of the wafer. The surface 113 is then used to support a smaller diameter part such as the 200 mm wafer. The body 114 of the unit has a stem 115 which is used to press into a formed hole in the support arms shown in FIG. 1.

FIG. 9 illustrates a magnified view of the local contact between a wafer 131 and a conformal radial location support 130. The conformal end 134 reduces the contact stress between the wafer and the end by having a profile that creates low contact stresses when it interacts with the diameter of the wafer. In this case, since the wafer diameter is so large, a good conformal surface is a simple flat surface with radial edges. Should a wafer 131 with an orientation notch 132 be held by the system, and the notch is at the radial location point, the end 134 will bridge the notch 132 with a minimum resulting error in wafer center distance error. The weight of the wafer in a horizontal position is partially supported by hemispherical surface 133.

In any system, however, in accordance with the invention, it is vital that contact points between the illustrative silicon part and the holding mechanism be designed to keep the contact stresses well below the allowable Hertz stress, and this is done using Hertz contact theory discussed in detail in the earlier cited references.

Figure 12A:
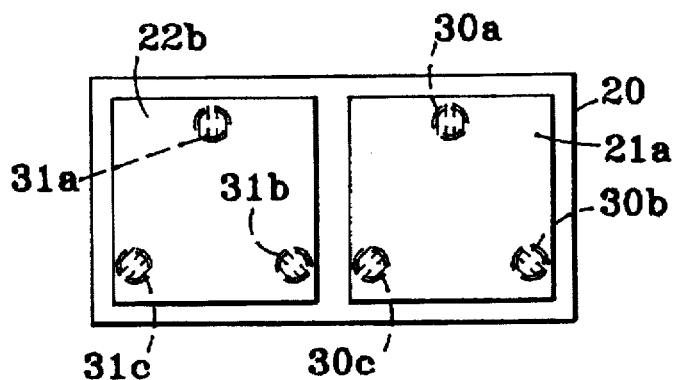
FIG. 12 is a three view drawing of a generic component attached to a machine with three sets of the damped kinematic mounting elements.
Figures 12B, 12C:
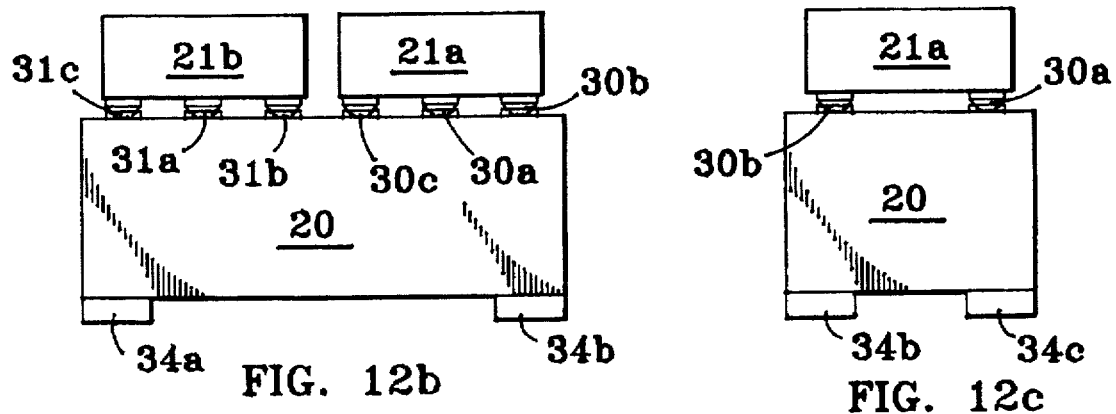

The designs shown here assume that the wafer is to be held horizontally, but, as before briefly discussed, they are also quite useful and adaptable for wafers held in an inclined position. FIG. 10 shows a system 300 for holding (storing) wafers, such as 301, at a 60-degree inclination that reduces gravity-induced bending stresses by 50%. Again, the same pattern on nesting or interleaving plate arms is used, where plate 303, similar to plate 1b in FIG. 12, is spaced from its neighbors by spacer plates such as 304, similar to plate 1a in FIG. 12. The wafer 301 is supported by three modular quasi-kinematic support units such as 100 which is equivalent to modular unit 100 in FIG. 7. These modular support units, however, may be passive as gravity acts to preload the wafers. A well-known robot that was meant to grip the wafers would merely have to have a rotating wrist R to lay the wafer into a horizontal position on a process tool. The robot gripper would be of the same shape as the support arm 303, except it would be a mirror image so it would interleave with the wafer holding system. Whether the angle is 0 degrees, 45, 60, or 80 degrees, moreover, depends upon the stress state that is acceptable in the wafer. The primary issue in terms of wafer transport is the increased risk of a wafer rattling between supports, and thus the shallower the angle the better from this perspective. Currently used storage systems (cassettes), indeed, are rectilinear and some have proposed a mechanism for rotating the entire cassette for storage and transport, and then rotating it horizontally when it is to be loaded or unloaded. But using a rhombic cassette 300 shown here, the cassettes could still be stacked laterally and such a rotating mechanism is eliminated. Furthermore, the robot gripper may be entirely passive. The robot, as before stated, would merely need a light-duty well-known wrist to rotate the wafer into the horizontal position.

Furthermore, this unique pattern of support points can easily be attached to a belt or conveyor system, so as to allow for conveyor means for transporting wafers between stations. Since the support points can handle either 200 mm or 300 mm wafers, the flexibility of the manufacturing plant will be substantially increased. This is illustrated in FIG. 16, where a conveyor 600 has mounted to it plates 601, 602, 603 and so on, where each plate has kinematic holding points on it such as the plate assembly 1 in FIG. 2. In this manner, a part or wafer could be carried from machine to machine continuously through a factory. As before, the unique assembly of kinematic support points flows a small (e.g., 200 mm diameter wafer) part to be held on the inner posts, and a larger part to be held on the top of the inner posts and laterally constrained by the outer posts, so its stress and deflection state is similar to that of the small part.

It should be noted that the components 21a and 21b in FIG. 12 can be wafer storage devices such as element 300 in FIG. 10, or storage device 1 in FIGS. 2 and 3. Furthermore, in some instances, the storage device may be required to be held in more than one orientation, so kinematic coupling means may be located on more than one side of the unit. The inclusion of several sets of kinematic coupling units 30a, 30b, and 30c on more than one side of the element 21a, for example, would be a new and novel application of these elements to allow a component to be repeatabily held in many orientations.

While heretofore described in connection with the important application to wafers and the like, the method and apparatus of the invention is clearly useful with other types of parts or components than round wafers, being used in the same manner and for the same advantages as the illustrative wafer. Other shapes of nesting gripper and tool arms are clearly useful and similarly operable, and the apparatus is entirely scalable to accommodate larger parts, as well.

With respect to the before-mentioned field of vibration reduction, in many instances, it is desired to locate a system in a manner that has a very high degree of static repeatability, while allowing it to have a high degree of dynamic damping. The method of kinematic coupling described above excels at the former, while it is lacking in the latter because it is a rigid mount. Conventional isolation mounts, as also referenced above, provide isolation between surfaces that are bolted to each side of the mount, but they have poor locational ability which requires components mounted with them to be adjusted in place.

The solution is to precision-form individual components of a kinematic coupling system and then assemble them, or mold the resilient material around the hard components, into sub-units which can be attached in modular form to a component. The hard grooves, mates to the resiliently formed components, would then be attached to the machine to which the component is to be mounted.

Figure 11:
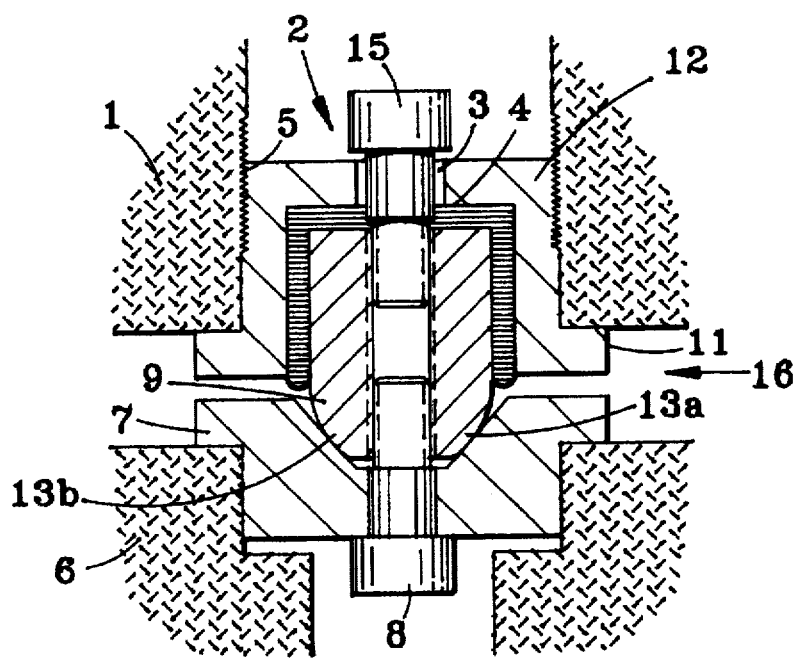
FIG. 11 is a cross section of one of the elements that establishes two of the six contact points, which shows the groove which is attached to the machine, in this case, and the cylindrical element, with its hemispherical end, potted in a resilient damped material in a cup that is screwed in to a component.

The design of one of the mounts, modular unit 16, is illustrated in FIG. 11, where a portion of a component 1 is shown at one of the points coupling to a portion of the machine 2. One half of the kinematic coupling insert 2 has threads on it, as at 5. There is also a flange 11 on this cup which is shown snug against the component 1. To adjust the height of the coupling more easily, the flange 11 could be left off, and the unit screwed to the desired height. It could be easily locked in place with well-known means, such as the use of a jamb nut.

Within the unit 2 is a cylindrical hemispherical-ended hard material insert 9 which is held to the cup body 12 by a resilient well-damped material (i.e., a resilient rubber) 4. The thickness and properties of the material can be selected by dynamic analysis of the system, as modeled using springs, masses, and damper elements, to form a second order system that is analyzed using a software package such as MathCad™. Typical properties of rubber to use for a 25 mm diameter unit would be 3-5 mm of rubber with a durometer value of 60-90. Silicone rubbers are well damped and would work well in this application.

It should be noted that it may be desirable to form the rubber insert 4 in a separate molding operation, and then press the pieces together. In this case, the cup 12 needs an air hole 3 in its backside, as well as may be required of the rubber cup, which will allow the system to be assembled without entrapping air. A bolt 15 can be used as a travel-limiting stop device to prevent the system from being pulled apart during severe loading.

The hemispherical end of the cylinder 2 seats in grooved component 7, which is pressed or screwed into a machine 6, and the interface is at the points 13a and 13b. The contact stresses are dependent on the relative radii or curvature, the materials, and the loads. To preload the system, a device such as a bolt 8 can be threaded into the hemispherical end.

A system that uses the mounts to position components 21a and 21b to a machine base 20 is shown in three views in FIG. 12. Component 21a is positioned with a high degree of repeatability to machine base 20 by modular kinematic mounts, equivalent to the modular unit 16 in FIG. 11, 30a, 30b, and 30c. Component 21b is positioned with a high degree of repeatability to machine base 20 by modular kinematic mounts, equivalent to the modular unit 16 in FIG. 11, 31a, 31b, and 31c. The machine base 20 would itself sit on feet, which typically also provide vibration isolation, such as 34a, 34b, 34c, and 34d (not visible in these views).

When a component 21a, for example, contains rotating systems, any vibration generated will be prevented from being transmitted to the machine base 20 by energy dissipation in the resilient rubber in the mounts 30a, 30b, 30c. When the rotation stops, and the machine settles down, because it is kinematically located, its position will most repeatably return to the position in which it started. Other types of mounts and joints are prone to joint slippage which reduces their locational repeatability. In addition, because the mounts are kinematic, and in this case of modular form, accurately drilled holes in the components and the machine base will allow for very accurate location of the component with respect to the base when it is first assembled.

Figure 13:
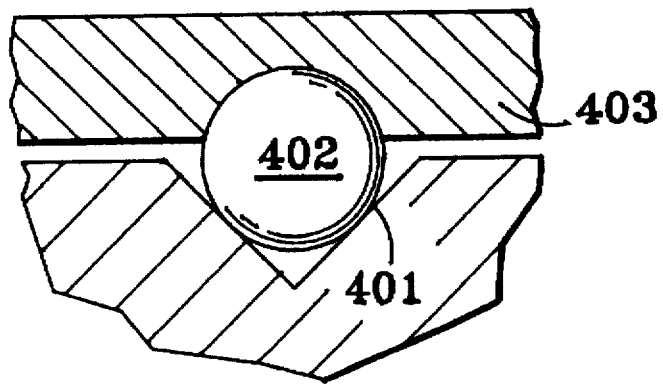
FIG. 13 is a section view through a classic kinematic coupling groove and support point showing a vee groove and a ball embedded in a part.

FIG. 13 shows the cross-section through structure 403 with a support, in this case a ball 402 anchored in it and resting in a groove 401. The equivalent radius of this system is defined from Hertzian theory by:

$$R_e = \frac{1}{\frac{1}{R_{groove\_major}} + \frac{1}{R_{groove\_minor}} + \frac{1}{R_{contact\_major}} + \frac{1}{R_{contact\_minor}}}$$

For a ball in a groove, the equivelent radius is $R_{ball}/2$. In order to minimize stress and maximize load capacity, Hertz contact theory, as described in the above cited references, requires the equivalent radius to be as large as possible. The fundamental theory of kinematic couplings requires that the groove have one axis with an infinite radius of curvature (a linear groove). Furthermore, to aid in manufacturability, the support point ideally should be a surface of revolution; but as shown in FIG. 15, the support point 410 can actually be a surface of revolution 413 or it could be a contoured surface 423 that is highly conformal to the groove. The easiest shape groove to manufacture is that of a vee-groove with flat sides, primarily because it is an interior surface and it is simplest to dress a wheel with flat sides. The support point can be made from a commercial ball bearing, but it can also be readily machined and polished or ground to be of any shape, such as shown in FIG. 15, using a CNC cylindrical grinder. As can be seen from the theory, if a surface of revolution is kept, then the best that one can obtain is if the support point was nearly a 45 degree cone. In order to have a larger effective radius, and hence greater load capacity, one must deviate from a surface of revolution.

FIG. 14 is a schematic drawing of the theory of the optimal shape for the contact surface and the correct shape for the top of the support point for blending with the side shapes and for minimum stress in a kinematic coupling as the part slides across the top of a rounded coupling member on its way to engageing a vee-shape groove. In this figure, the groove material 405 contacts the support point 407 at point 406. The top of the support point 407 has a rounded portion 408. Note that the side contacts are based on a Gothic arch shape with a radius R whose center point is offset from the contact point by an amount in the X and Y directions of (l+L). The shape of the top portion can be a sphere, or for a greater effective radius of curvature while still being able to blend with the side curves, a higher order polynominal such as a parabola can be used. Note that it is impractical to base this type of a shape on a round post to be inserted in a hole, because unlike a surface of revolution, this shape has a required orientaton. In order to kill two birds with one stone, so to speak, the same size 45 degree vee-groove can be used for both the mating vee and as a vee to locate and orient the support point. Hence the support point of this type could have a vee-base 425 as shown in FIG. 15.

In the first simple case, support point 410 has a stem 414, which may be threaded, for securing it into a part, and a head with curved contact surface 411 which has a large effective radius as described above for minimizeing contact stresses. The top surface 412 has a large effective radius of curvature and tangentially blends with the side curves. In this manner, if a part is contacting the top surface, it will cause lower contact stresses, and stresses will be kept to a minimum as the support point slides across a surface and into a vee groove, which should also have a blended radius to its surface.

In the above theory, it was assumed that only one radius of curvature could be exaggerated, and this would be true in the case of grinding the groove. As shown in FIG. 15, there are 2 practical implementations of the theory of FIG. 14, where in one case, for ten times improvement in load capacity, the support point is a surface of revolution with the contact point radius of curvature being 10 times the nominal ball diameter; and in the other case, a 100 times improvement in load capacity is also obtained by making the axis of rotation radius of curvature 10 times the nominal ball diameter.

In many applications, it will be desirable, however, to use a simple surface of revolution, which in its simplest form is just a hemisphere. Where more load capacity is required, Hertz contact theory is used, as described in the above-referenced papers, and the results implemented as described in this invention. When maximum load capacity is required, a more complex two-dimensional shape 420, FIG. 15, should be used. To illustrate the differences in load capacity, consider a 25 mm hemisphere acting on one side of a vee-groove. For a hardened steel ball on a hardened steel groove, the maximum load it can support is 2,400 Newtons (540 lbs). If one axis of curvature is 250 mm, while the other axis remains 25 mm, the maximum load it can support is 16,600 Newtons (3,700 lbs). If both axis of curvature are set to 250 mm, then the maximum load it can support is 240,000 Newtons (53,800 lbs). Thus by carefully designing the shape of the contact points, even with point contacts, an incredibly high load capacity can be obtained.

The invention is applicable to other than fixed station use. FIG. 16 schematically illustrates a conveyor with the kinematic support points attached to a plate that is attached to the conveyor, such that even when the conveyor rounds a corner, the support points maintain constant distance. This unique pattern of support points can easily be attached to a belt or conveyor system, so as to allow for conveyor transporting of wafers or other objects between stations. Since the support points can handle either small or large wafers, such as 200 mm or 300 mm wafers, the flexibility of the manufacturing plant can thus be substantially increased. In the embodiment of FIG. 16, the conveyor 600 has mounted to it plates 601, 602, 603, and so on, where each plate has kinematic holding points on it similar to the plate assembly 1 in FIG. 2. In this manner, a part or wafer may be carried from machine to machine continuously through a factory. As before, the unique assembly of kinematic support points allows a small (e.g., 200 mm wafer) part to be held on the inner posts, and a larger part to be held on the top of the inner posts, laterally constrained by the outer posts, so its stress and deflection state is similar to that of the small part.

Further modifications of the invention will also occur to persons skilled in this art, and all such are deemed to fall within the spirit and scope of the invention as defined by the appended claims.

What is claimed is:

1. An apparatus for kinematically gripping and transferring a part having, in combination, nestable planar gripper and tool arms each having at least two spaced leaves for nesting and each respectively provided with a set of three equilaterally co-planar spaced curved contact surface elements, with the elements of the gripper arm circumferentially displaced 60° from the corresponding elements of the tool arm; the part having six 60°-spaced peripheral grooves; means for relatively laterally moving and lowering and raising the gripper arm for placing the part upon the gripper arm with the gripper arm set of elements contacting three of the plate grooves to hold the part and for relatively laterally moving and lowering and raising the gripper arm relative to the nesting tool arm to cause the tool arm set of elements to contact the other three of the part grooves so as to transport and transfer the part from the gripper arm to the tool arm, and when desired, to cause the gripper arm to pick up the part from the tool arm, all with the location of the part uniquely established and defined in space, thus enabling repeatability while minimizing imposing stresses on the part.

2. Apparatus as claimed in claim 1 and in which the curved contact surface elements are cones held by the respective arms and that each contact two points of each of the corresponding part grooves, providing six unique contact points for each set of three cones.

3. Apparatus as claimed in claim 2 and in which each cone is provided with a top safety device to keep the part from sliding off the cone upon jarring.

4. Apparatus as claimed in claim 2 and in which a radial clamp means is provided supplemental to each cone for applying a radial force to the part to clamp the same as during transfer.

5. Apparatus as claimed in claim 4 and in which each said radial clamp means comprises one of pneumatic, vacuum-operated, and electromagnetic clamp applying a radial force to the part.

6. Apparatus as claimed in claim 5 and in which said electromagnetic clamp comprises magnetic means displaced in a radial groove in the said cone.

7. Apparatus as claimed in claim 2 and in which the means for moving is provided operating the respective arms horizontally and when desired tilted at an angle to the horizontal.

8. Apparatus as claimed in claim 1 and in which each of the gripper arm and tool arm is provided with a further set of co-planar spaced curved contact surface elements disposed circumferentially at a greater diameter than the first-named set, for storage transfer and transfer of a larger part between them.

9. Apparatus as claimed in claim 1 and in which the gripper arm and tool arm plates are of U-shape with their respective sets of co-planar curved contact surface elements being conical elements protruding from the plates.

10. Apparatus as claimed in claim 1 where said combination includes a semiconductor wafer part.

11. Apparatus as claimed in claim 2 wherein said moving means supports said part held on said cones on its backside, thereby helping to minimize the bending stresses in said part during storage and transport.

12. Apparatus as claimed in claim 1 wherein there are provided multiple gripper and tool arms for storing multiple parts.

13. Apparatus as claimed in claim 1 wherein said tool arm is attached to a process tool for processing said part.

14. Apparatus for kinematically holding a part while simultaneously kinematically picking up and transferring the part, having, in combination, a part the periphery of which is grooved at six points spaced 60° angularly apart; gripper and tool planar plates each comprising at least two spaced leaves, said plates being relatively movable and interleavingly nestable with respective sets of three equilateral curved contact elements thereon spaced to correspond to the periphery of the part with the sets peripherally displaced 60° from one another when the plates are interleaved, means for enabling the placing of the part upon the gripper plate with its set of contact elements contacting three of the grooves of the part to hold the part; and means for relatively moving the gripper and interleaving tool plates to transfer the part from the gripper plate to the tool plate with its set of contact elements contacting the remaining three grooves of the part, thus kinematically uniquely establishing and defining in space the position of the part with repeatability and with minimum stress imposed on the part.

15. Apparatus as claimed in claim 14 and in which the contact elements are conical, the interleaving gripper and tool plates are U-shaped, and the part and the periphery are round.

16. Apparatus as claimed in claim 14 and in which the moving means retransfers the part from the tool plate to the gripper plate and laterally separates the gripper plate from the tool plate.

17. A method of kinematically holding a part while simultaneously kinematically picking up and transferring the part, that comprises, grooving the periphery of the part at six points spaced 60° angularly apart; providing a pair of relatively moveable and nestable interleaving planar plates with respective sets of three equilaterally curved contact elements thereon and spacing the sets to correspond to the periphery of the part but with the sets peripherally displaced 60° from one another when the plates are nested; supporting the part upon one of the plates with its set of contact elements contacting three of the grooved points of the part to hold the part; moving the one plate relative to the other interleaving plate to transfer the part thereto with the set of contact elements of the other plate contacting the remaining three grooved points of the part, thus kinematically uniquely establishing and defining in space the position of the part with repeatability and with minimum stress imposed on the part.

18. A method as claimed in claim 17 and in which the curved contact elements are formed into conical shapes.

19. A method as claimed in claim 17 and in which the plates are each provided with further sets of similar curved contact elements spaced thereon to define a periphery of greater dimensions than the first-named periphery to accommodate the storage and transfer of a further part of a larger periphery than the first-named part.

20. A method as claimed in claim 17 and in which the periphery is circular.

21. Apparatus for holding a part while simultaneously picking up and transferring the part, having, in combination, gripper and tool planar plates with spaced leaves and relatively movable and interleavingly nestable with respective sets of three equilateral curved contact elements thereon spaced to correspond to the periphery of the part and protruding therefrom with the sets displaced 60° from one another; means for enabling placing the part upon the gripper plate with its set of contact elements contacting and supporting the part and; for relatively moving the gripper and interleaving tool plates to transfer the part from the gripper plate to the tool plate with its set of contact elements contacting the part, thus establishing and defining in space the position of the part with minimum stress imposed on the part.

22. Apparatus as claimed in claim 21 and in which the part transfer is effected kinematically by the use of six peripheral grooves formed in the part at points spaced 60° angularly apart and in which the gripper plate contact elements contact three of the part grooves and, upon transfer, the tool plate contact elements contact the remaining three part grooves.

23. Apparatus as claimed in claim 21 and in which the part transfer is effected quasi-kinematically, wherein the equilateral curved contact elements each comprise two substantially orthogonal curved surfaces for supporting both the underside and also the edge of the part, the curved surface for supporting the edge of the part comprising an actuator means for moving said curved surface for supporting the edge to clamp the edge.

24. Apparatus for quasi-kinematically holding parts on such devices as process tools or storage cassettes while allowing them to be quasi-kinematically gripped and transferred from one tool to another or from a storage device to a process tool, having, in combination, first and second plates having spaced leaves for interleaving, the first plate being provided with three sets of two substantially orthogonal curved surfaces, equilaterally spaced along the plate, means for enabling contacting the underside of a part with the sets of curved surfaces at three equilaterally spaced points each thereby establishing quasi-kinematic support contact and also contacting the edge of the part by at least two of the curved surfaces orthogonal to the curved surfaces contacting the underside of the part by actuators comprising said at least two curved surfaces, said actuators moving said at least two curved surfaces to engage the edge; the second plate interleavable with the first plate and having similar three sets of two substantially orthogonal curved surfaces; means for relatively moving the second plate up and under the part to engage the part and transfer it from the first plate to the curved contacting surfaces of the second plate, thereby achieving quasi-kinematic location before and after transfer.

25. Apparatus for kinematically holding a part while simultaneously kinematically picking up and transferring the part, having, in combination, a part the periphery of which is grooved at six points spaced 60° angularly apart; a pair of relatively moveable and nestable planar plates with spaced leaves for interleaving with respective sets of three equilaterally curved contact elements thereon, with the sets spaced to correspond to the periphery of the part but with the sets peripherally displaced 60° from one another when the plates are nested: the part being supported upon one of the plates with its set of contact elements contacting three of the grooved points of the part to hold the part; means connected with at least one of said plates for moving the same relative to the other interleaving plate to transfer the part thereto with the set of contact elements of the other plate contacting the remaining three grooved points of the part, thus kinematically uniquely establishing and defining in space the position of the part with repeatability and with minimum stress imposed on the part.

26. Apparatus as claimed in claim 25 and in which the curved contact elements are of conical shapes.

27. Apparatus as claimed in claim 25 and in which the plates are each provided with further sets of similar curved contact elements spaced thereon to define a periphery of greater dimensions than the first-named periphery to accommodate the storage and transfer of a further part of a larger periphery than the first-named part.

28. Apparatus as claimed in claim 25 and in which the periphery is circular.

* * * * *